March 7, 1967 A. E. IMHOFF 3,307,442
ELECTRICAL COMPONENT LEAD-END SHEARING DEVICE
Filed July 15, 1965

INVENTOR.
ALFRED E. IMHOFF
BY
Wallace P. Lamb
ATTORNEY.

3,307,442

ELECTRICAL COMPONENT LEAD-END SHEARING DEVICE

Alfred E. Imhoff, Oak Park, Mich., assignor to Burroughs Corporation, Detroit, Mich., a corporation of Michigan Filed July 15, 1965, Ser. No. 472,154
5 Claims. (Cl. 83—580)

Figures 1, 2:
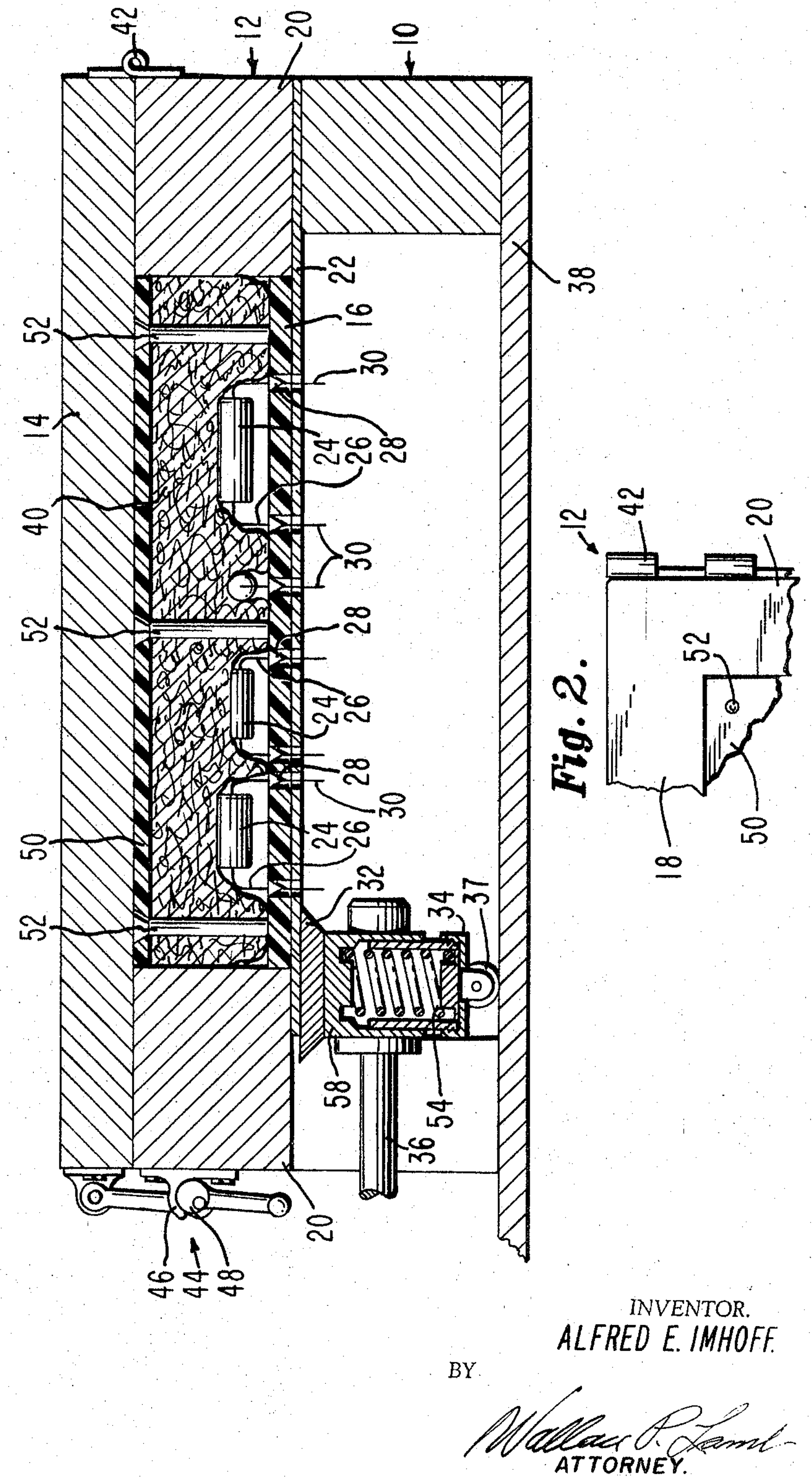

This invention relates generally to shearing devices and particularly to a shearing device for shearing end portions of electrical conductors of a printed circuit board assembly.

It is an object of the invention to provide an improved shearing device for shearing unwanted end portions of electronic component conductors projecting from one side of a mounting board.

Another object of the invention is to provide an improved shearing device for removing, in one stroke of a shear tool, unwanted tips of electronic component conductors, projecting beyond a face of a mounting board therefor.

In connection with the next preceding object, it is a specific object of the invention to provide a shearing tool which will traverse the surface of a mounting board to remove unwanted conductor tips projecting therefrom and will travel a path parallel to said surface irrespective of warpage of the board.

Another object of the invention resides in the holding of an assembly of electronic components and mounting board therefor firmly against a shear plate and at the same time hold and insulate the electronic components against the vibratory shock of the shearing tool operation.

Other objects of the invention will become apparent from the following descripton, taken in connection with the accompanying drawings in which:

FIG. 1 is a vertical sectional view of my shear device, embodying features of the invention, and FIG. 2 is a fragmentary plan view.

Referring to the drawing by characters of reference, the shearing device comprises in general a hollow base 10, a part holder 12 and a part clamp 14. The holder 12 is mounted on the base 10 and the clamp 14 is mounted on and is a component of the holder.

The holder 12 is a box-like structure having a bottom wall 16, side walls 18, of which only one is shown, and end walls 20. These walls define a rectangular cavity which snugly, but freely, receives a printed circuit board 22 which rests flat on the bottom wall 16. Mounted on and above the board 22 are electronic components 24 each having a pair of electrical leads or conductors 26 which extend through holes in the board for connection to printed circuit terminals (not shown) on the underside of the board. Secured to each of the conductors 26 there is a wedge 28 which is forced into the board holes to hold the components in place while their conductors are soldered to the circuit terminals.

As shown in FIG. 1, ends, or tips 30, of the conductors 26 project below the lower side of the board 22 and while these tips 30 are useful as pilots in the inserting of the leads into the board holes, they are now objectionable as the boards are usually inserted in narrow openings in a bank of such boards and the tips interfere with the insertion.

The bottom wall 16 of the holder 12 is a shear plate and is provided with holes through which the unwanted tips 30 of the leads 26 extend and project below the underside of the shear plate as shown. These unwanted tips are sheared by a reciprocal shear blade 32, mounted on the top of a carrier 34 beneath the shear plate 12. Any suitable power means, such as an air cylinder (not shown) may be employed to reciprocate the carrier 34 and therefore the shear blade 32 and the power means may be connected to the carrier by a connecting rod 36. A flat bed plate 38 of the base 10 provides support and runway for the wheels 37 of the carrier 34.

In accordance with my invention, I provide a resilient vibration insulator or cushion 40 for holding the electronic components 24 against vibratory shock of the shearing operation and resultant damage to the components. The cushion 40 may be made of any suitably displaceable resilient material, such as, a fibrous mat or foam rubber or any other suitable shock absorber which will form around, but will not exert any appreciable pressure on the components 24. The cushion 40 is displaced by the clamp 14, which is in the form of a cover and overlies and closes the top of the holder cavity. At one edge, the clamp 14 may be hinged to the holder 12, as at 42, and at the opposite edge, a suitable latch device 44 for latching the clamp in hold-down position is provided. Any suitable type of latch device may be employed, the type shown being a well known device having a keeper 46 and an eccentric latch member 48 cooperable to hold the clamp 14 in clamping position. The cushion 40 is attached to the underside of an upper plate 50 which fits into the holder cavity and is engaged by the underside of the clamp 14, as shown in FIG. 1. Affixed to the plate 50 there is a plurality of vertical spacer pins 52 which seat at their lower ends against the upper surface of the printed circuit board to hold the board firmly down against the shear plate 16, the upper surface of the plate 50 being flush with the upper end of the holder. The cushion 40 is attached to the plate 50 such that they are removable as a unit from the holder cavity and may be attached by a suitable cement or by any other suitable means. It will be understood that the thickness of the cushion 40 is normally greater than the depth of the holder cavity such that when the clamp 14 is applied, the cushion material will be displaced and packed around the electronic components substantially as illustrated so as to dampen vibrations of the shearing tool operation which otherwise might damage the delicate components.

The electronic components are preferably inserted in the holes in the printed circuit board by an inserter machine, such as is disclosed by the patent to Lawrence E. Mueller, No. 3,167,780, which presses the conductor wedges 28 into the board holes to frictionally hold the components in place preparatory to the soldering of the conductor tips to the printed circuit terminals. However, the shearing operation is performed prior to the soldering operation and the thickness of the shear plate determines the length of tip which will be left, after shearing for solder connection to the circuit terminals. Preferably, the thickness of the shear plate 16 is about .015 inch.

Further in accordance with the invention, the shear tool 32 is yieldingly urged upwardly by a coil spring 54 so as to insure the trimming of the conductor tips to uniform lengths irrespective of any warpage of the printed circuit board 22. As shown, the wheels 37, of which there may be two or more, support the hollow carrier 34 wherein one or more of the springs 54 seat and on their upper ends support the shear plate 32 which has a body portion 58 that slidably fits over the carrier 56 for vertical movement relative thereto. The springs 54 are under sufficient compression to hold the shear tool 32 against the underside of the shear plate 16 as the blade transverses the shear plate.

What is claimed is:

1. A device for shearing end portions of electrical conductors projecting from electronic components and from one side of a printed circuit board on which the components are mounted comprising a flexible shear plate, means holding said shear plate against movement edgewise, said shear plate having one side thereof for receiving the board in broadside relationship and having holes through which end portions of the conductors project beyond the opposite side of said shear plate, a shearing tool movable to traverse the other side of said shear plate to shear the projecting end portions of the conductors, a removable displaceable material positioned in overlying relationship to the said one side of said shearing plate with the board therebetween and displaceable to pack around and insulate the components against shock, and means to hold said material displaced toward said shearing plate.

2. A device for shearing end portions of electrical conductors projecting from electronic components and from one side of a printed circuit board on which the components are mounted comprising a flexible shear plate, means holding said shear plate against edgewise movement, said shear plate having one side thereof for receiving a component mounting board in broadside relationship and having a pattern of holes through which end portions of conductors extend from said board and project beyond the other side of said shear plate, a shearing tool to traverse said other side of said shear plate and shear the projecting end portions of the conductors, means to hold the printed circuit board against said shear plate, and yieldable means urging said shearing tool against said shear plate and said shear plate against the mounting board.

3. A device for shearing end portions of electrical conductors projecting from electronic components and from one side of a printed circuit board on which the components are mounted comprising a holder including sides of a cavity to receive the circuit board and components, a flexible shear plate forming the bottom wall of said cavity to receive and support the circuit board with the conductors projecting below said shear plate through holes therein, means to hold the circuit board down against said shear plate, a shear tool movable to traverse the underside of said shear plate and shear the projecting end portions of the conductors, spring means urging said shear tool against the underside of said shear plate, and a cushion of displaceable material displaced within said cavity by said means to insulate the electronic components against vibratory shocks of the shearing operation.

4. A device for shearing end portions of electrical conductors projecting from electrical components and from one side of a printed circuit board on which the components are mounted comprising a horizontal supporting member, a box mounted on said supporting member and having a flexible shear plate forming the bottom wall of said box and spaced above said supporting member, said flexible shear plate to receive and support the component mounting board in broadside relationship thereto with unwanted end portions of the conductors projecting through and below said shear plate, a shear tool mounted on said supporting member to traverse the underside of said shear plate to shear the unwanted end portions of the conductors, spring means urging said shearing tool upwardly against said shear plate to force the latter against the underside of the mounting board, removable displaceable material within said box above the mounting board and displaceable to pack around and insulate the components against the vibratory shock of the shearing operation, and a cover on the top of said box closable to displace said material and also to hold the printed circuit board down against said shear plate.

5. A device for shearing end portions of electrical conductors projecting from electronic components and from one side of a printed circuit board on which the components are mounted comprising a holder to receive a printed circuit board and electronic components including means forming a cavity, a flexible shear plate forming the bottom wall of the cavity to support the printed circuit board and components within the cavity, said shear plate having holes through which unwanted end portions of the conductors project below said shear plate, a movable shear tool mounted below said shear plate in engagement with the underside thereof and operable to traverse said shear plate and shear the unwanted end portions of the conductors, means yieldingly urging said shear tool against the underside of said shear plate, a removable cover for said cavity, a removable resilient cushion of displaceable material insertable in said cavity above the electronic components and displaceable to pack around and insulate the components against the shock of the severing operation, a plate attached to and removable from the cavity with said cushion, said plate positioned above said cushion and held in an upper position by said cushion for engagement by and upon the closing of said cover, and spacer members carried by said last-mentioned plate and extending through said cushion to seat against the printed circuit board by and when said cover is in closed position.

References Cited by the Examiner

FOREIGN PATENTS

| | | |
|---|---|---|
| 901,724 | 7/1962 | Great Britain. |
| 487,018 | 6/1938 | Great Britain. |

ANDREW R. JUHASZ, *Primary Examiner.*

WILLIAM W. DYER, Jr., L. B. TAYLOR, *Examiners.*